US012791925B2

(12) United States Patent
Li et al.

(10) Patent No.: US 12,791,925 B2
(45) Date of Patent: Nov. 10, 2026

(54) LASER DEVICE AND LASER PROJECTION APPARATUS

(71) Applicant: HISENSE LASER DISPLAY CO., LTD, Qingdao (CN)

(72) Inventors: Jianjun Li, Qingdao (CN); Xin Zhang, Qingdao (CN); Youliang Tian, Qingdao (CN); Xintuan Tian, Qingdao (CN)

(73) Assignee: HISENSE LASER DISPLAY CO., LTD, Qingdao (CN)

( * ) Notice: Subject to any disclaimer, the term of this patent is extended or adjusted under 35 U.S.C. 154(b) by 379 days.

(21) Appl. No.: 18/391,280

(22) Filed: Dec. 20, 2023

(65) Prior Publication Data

US 2024/0128709 A1 Apr. 18, 2024

Related U.S. Application Data

(63) Continuation of application No. PCT/CN2022/100506, filed on Jun. 22, 2022.

(30) Foreign Application Priority Data

Jun. 22, 2021 (CN) ......................... 202110693475.3
Jun. 22, 2021 (CN) ......................... 202110693801.0
Sep. 9, 2021 (CN) ......................... 202111057909.7

(51) Int. Cl.
*G03B 21/20* (2006.01)
*H01S 5/02216* (2021.01)
(Continued)

(52) U.S. Cl.
CPC ...... *G03B 21/2033* (2013.01); *H01S 5/02216* (2013.01); *H01S 5/02253* (2021.01);
(Continued)

(58) Field of Classification Search
CPC ............. H01S 5/02216; H01S 5/02253; H01S 5/02257; H01S 5/02315; H01S 5/4031;
(Continued)

(56) References Cited

U.S. PATENT DOCUMENTS 6,587,481 B1 7/2003 Seong et al.
2017/0338628 A1* 11/2017 Matsushita ......... H01S 5/02216
(Continued)

FOREIGN PATENT DOCUMENTS

CN 1273415 A 11/2000
CN 205578725 U 9/2016
(Continued)

OTHER PUBLICATIONS

International Search Report and Written Opinion dated Aug. 29, 2022 in corresponding International Application No. PCT/CN2022/100506, translated, 21 pages.
(Continued)

*Primary Examiner* — Magda Cruz
(74) *Attorney, Agent, or Firm* — MH2 Technology Law Group LLP

(57) ABSTRACT

A laser device includes a shell, an upper cover assembly, a plurality of light-emitting assemblies, and a plurality of conductive pins. The shell includes a base plate, a frame body, and a first flange. The first flange is bent relative to the frame body and is fixedly connected to the base plate. The upper cover assembly is fixed to the shell. The plurality of light-emitting assemblies are disposed on the base plate. Any one of the plurality of conductive pins is electrically connected to a light-emitting assembly. The frame body includes a plurality of flanging holes. A depth of any one of the plurality of flanging holes is greater than a thickness of the frame body. A portion of the any one of the plurality of
(Continued)

conductive pins is located at an outside of the accommodating space through a corresponding flanging hole.

19 Claims, 5 Drawing Sheets

(51) Int. Cl.

| | |
|---|---|
| ***H01S 5/02253*** | (2021.01) |
| ***H01S 5/02257*** | (2021.01) |
| ***H01S 5/02315*** | (2021.01) |
| ***H01S 5/40*** | (2006.01) |
| *H01S 5/02255* | (2021.01) |
| *H01S 5/024* | (2006.01) |

(52) U.S. Cl.
CPC ...... *H01S 5/02257* (2021.01); *H01S 5/02315* (2021.01); *H01S 5/4031* (2013.01); *H01S 5/02255* (2021.01); *H01S 5/02469* (2013.01)

(58) Field of Classification Search
CPC ............. H01S 5/02255; H01S 5/02218; H01S 5/02469; H01S 5/4093; H01S 5/4025; G03B 21/2033
USPC ............................................................ 353/94
See application file for complete search history.

(56) References Cited

U.S. PATENT DOCUMENTS

| | | | | |
|---|---|---|---|---|
| 2019/0088818 | A1 | 3/2019 | Niizeki et al. | |
| 2019/0165542 | A1 | 5/2019 | Hashimoto et al. | |
| 2019/0324360 | A1 | 10/2019 | Shimizu et al. | |
| 2020/0224826 | A1* | 7/2020 | Tian | G03B 21/2033 |
| 2021/0083451 | A1 | 3/2021 | Hashimoto | |
| 2021/0320719 | A1 | 10/2021 | Nagashima et al. | |

FOREIGN PATENT DOCUMENTS

| | | | | |
|---|---|---|---|---|
| CN | 206490110 | U | 9/2017 | |
| CN | 107404063 | A | 11/2017 | |
| CN | 208360727 | U | 1/2019 | |
| CN | 209388075 | U | 9/2019 | |
| CN | 110389493 | A | 10/2019 | |
| CN | 112825409 | A * | 5/2021 | H01S 5/4025 |
| CN | 112909729 | A | 6/2021 | |
| CN | 113228303 | A | 8/2021 | |
| CN | 113422287 | A | 9/2021 | |
| CN | 113451875 | A | 9/2021 | |
| CN | 113764973 | A | 12/2021 | |
| JP | 2006066431 | A | 3/2006 | |
| JP | 2018085368 | A | 5/2018 | |

OTHER PUBLICATIONS

Chinese First Office Action dated Feb. 28, 2022 in corresponding Chinese Application No. 202110693475.3, translated, 16 pages.

Chinese Notification to Grant Patent Right for Invention dated Sep. 27, 2022 in corresponding Chinese Application No. 202110693475.3, translated, 8 pages.

Chinese First Office Action dated Jul. 19, 2025 in corresponding Chinese Application No. 202211590399.4, translated, 14 pages.

Chinese Second Office Action dated Sep. 11, 2025 in corresponding Chinese Application No. 202211591226.4, translated, 14 pages.

Chinese First Office Action dated Apr. 14, 2026 in corresponding Chinese Application No. 202110693801.0, translated, 16 pages.

* cited by examiner

LASER DEVICE AND LASER PROJECTION APPARATUS

CROSS-REFERENCE TO RELATED APPLICATIONS

This application is a continuation application of International Patent Application No. PCT/CN2022/100506, filed on Jun. 22, 2022, which claims priority to Chinese Patent Application No. 202110693801.0, filed on Jun. 22, 2021, Chinese Patent Application No. 202110693475.3, filed on Jun. 22, 2021, and Chinese Patent Application No. 202111057909.7, filed on Sep. 9, 2021, which are incorporated herein by reference in their entireties.

TECHNICAL FIELD

The present disclosure relates to the field of photoelectric technologies and, in particular, to a laser device and a laser projection apparatus.

BACKGROUND

With the development of photoelectric technologies, laser devices are widely used. The laser devices have been used more and more widely due to its pure light quality and stable spectrum. For example, a laser device may be used in a laser projection apparatus. The laser projection apparatus is a projection display apparatus such as a laser television and a laser projector that adopts a laser source as a display light source and utilizes the projection display technologies to form an image.

SUMMARY

A laser device includes a shell, an upper cover assembly, a plurality of light-emitting assemblies, and a plurality of conductive pins. The shell includes a base plate and a frame. The frame is disposed on the base plate and is connected to the base plate, so as to provide an accommodating space with an opening. The frame includes a frame body and a first flange. The first flange is bent relative to the frame body and is fixedly connected to the base plate. The upper cover assembly is fixed to the shell and close the accommodating space. The plurality of light-emitting assemblies are located in the accommodating space and are disposed on the base plate. The plurality of conductive pins correspond to the plurality of light-emitting assemblies. Any one of the plurality of conductive pins is electrically connected with a corresponding light-emitting assembly. The frame body includes a plurality of flanging holes, and the plurality of flanging holes correspond to the plurality of conductive pins. A depth of any one of the plurality of flanging holes is greater than a thickness of the frame body. A portion of the any one of the plurality of conductive pins is located at an outside of the accommodating space through a corresponding one of the plurality of flanging holes.

BRIEF DESCRIPTION OF THE DRAWINGS

In order to describe the technical solutions of the embodiments of the present disclosure more clearly, accompanying drawings to be used in some embodiments of the present disclosure will be introduced briefly below. However, the accompanying drawings to be described below are merely some embodiments of the present disclosure, and a person of ordinary skill in the art may obtain other drawings according to these drawings. In addition, the accompanying drawings to be described below may be regarded as schematic diagrams and are not limitations on an actual size of a product, an actual process of a method, and an actual timing of a signal to which the embodiments of the present disclosure relate.

DETAILED DESCRIPTION

Figure 1:
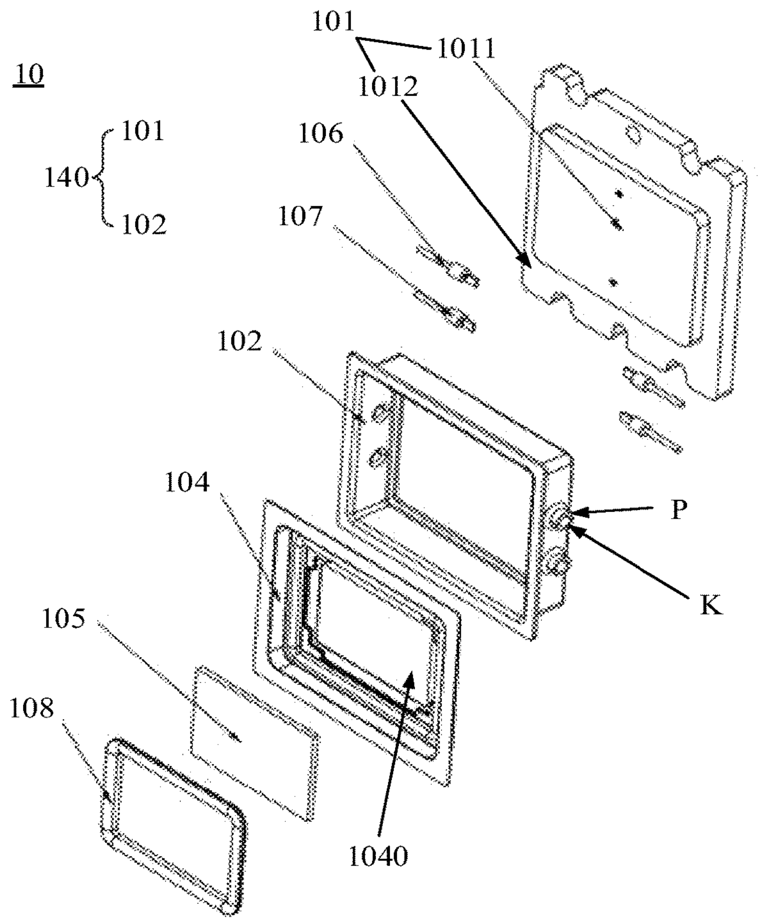
FIG. 1 is an exploded view of a laser device, in accordance with some embodiments.

The technical solutions in some embodiments of the present disclosure will be described clearly and completely with reference to the accompanying drawings. However, the described embodiments are merely some, but not all, embodiments of the present disclosure. All other embodiments obtained by a person of ordinary skill in the art based on embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "example," "specific example," or "some examples" are intended to indicate that specific features, structures, materials, or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

The terms "first" and "second" are used for descriptive purposes only and are not to be construed as indicating or implying a relative importance or implicitly indicating a number of indicated technical features. Thus, features defined by "first" or "second" may explicitly or implicitly include one or more of the features. In the description of the embodiments of the present disclosure, the term "a plurality or of" "the plurality of" means two or more unless otherwise specified.

The phrase "A and/or B" includes the following three combinations: only A, only B, and a combination of A and B.

The phrase "at least one of A, B, and C" has the same meaning as the phrase "at least one of A, B, or C," and they both include the following combinations of A, B, and C only A, only B, only C, a combination of A and B, a combination of A and C, a combination of B and C, and a combination of A, B, and C.

The terms such as "about," "substantially," and "approximately" as used herein include a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

The terms such as "parallel," "perpendicular," or "equal" as used herein include a stated condition and a condition similar to the stated condition. A range of the similar condition is within an acceptable deviation range, and the acceptable deviation range is determined by a person of ordinary skill in the art, considering measurement in question and errors associated with measurement of a particular quantity (i.e., the limitations of a measurement system). For example, the term "parallel" includes absolute parallelism and approximate parallelism, and an acceptable range of deviation of the approximate parallelism may be, for example, a deviation within 5°. The term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of the approximate equality may be that, for example, a difference between the two that are equal is less than or equal to 5% of either of the two.

Figure 10:
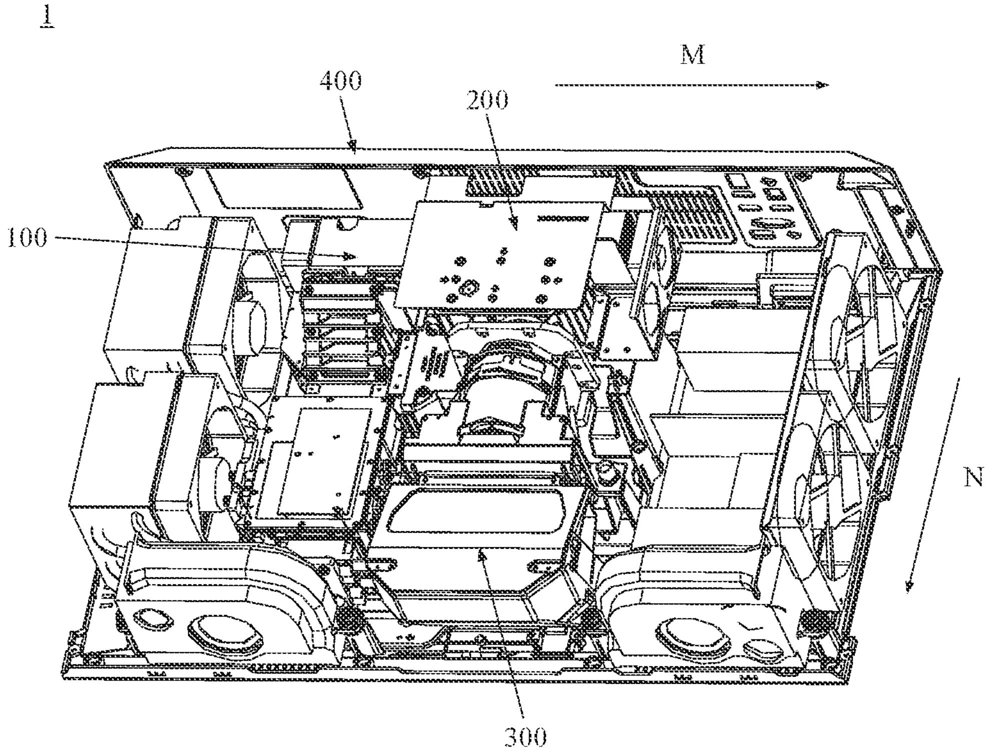
FIG. 10 is a structural diagram of a laser projection apparatus, in accordance with some embodiments.

Some embodiments of the present disclosure provide a laser projection apparatus. As shown in FIG. 10, the laser projection apparatus 1 includes a housing 400 (only a part of the housing being shown in FIG. 10), and a laser source 100, an optical modulation component 200, and a projection lens 300 that are assembled in the housing 400. The laser source 100 is configured to output illumination beams (i.e., laser beams). The optical modulation component 200 is configured to modulate the illumination beams output by the laser source 100 with image signals to obtain projection beams. The projection lens 300 is configured to project the projection beams on a projection screen 20 for imaging.

The laser source 100, the optical modulation component 200, and the projection lens 300 are connected to each other in a propagation direction of beams. It will be noted that the above naming of various parts of the laser projection apparatus is only based on the main functions of each optical component. For example, the laser source 100 is mainly used to output laser beams. The optical modulation component 200 is mainly used for optical modulation, and the projection lens 300 is mainly used for amplifying projected image beams. In some embodiments, the laser source 100 and the optical modulation component 200 do not need to be clearly distinguished. It may be considered that the laser source 100 and the optical modulation component 200 form an optical modulation component module to output modulated image beams to the projection lens 300.

In some embodiments, an end of the optical modulation component 200 is connected to the laser source 100, and another end of the optical modulation component 200 is connected to the projection lens 300. The laser source 100 and the optical modulation component 200 are disposed in an exit direction (referring to the direction M shown in FIG. 10) of the illumination beams of the laser projection apparatus 1, and the optical modulation component 200 and the projection lens 300 are disposed in an exit direction (referring to the direction N as shown in FIG. 10) of the projection beams of the laser projection apparatus 1. The direction M is substantially perpendicular to the direction N. That is, the laser source 100, the optical modulation component 200, and the projection lens 300 are connected in a shape of an L. On one aspect, such a connection structure may adapt to characteristics of an optical path of a reflective light valve in the optical modulation component 200. In another aspect, it is also conducive to shortening a length of an optical path in one dimension direction, which is in turn conducive to a structural arrangement of a projection host. For example, in a case where the laser source 100, the optical modulation component 200, and the projection lens 300 are disposed in one dimension direction (e.g., the direction M), a length of an optical path in the direction is relatively long, which is not conducive to the structural arrangement of the projection host.

In some embodiments, the laser source 100 may output laser beams of the three primary colors sequentially (laser beams of other color may also be added on the basis of the laser beams of three primary colors). However, due to a phenomenon of visual persistence of human eyes, what the human eyes see is white beams formed by mixing the beams of the three primary colors. The laser source 100 may also simultaneously output the laser beams of the three primary colors and continuously emit the white laser beams. The laser source 100 includes a laser device 10 (as shown in FIGS. 1 to 9), and the laser device may emit laser beams of a single color, such as a red laser beam, a blue laser beam, or a green laser beam.

The illumination beams emitted by the laser source 100 enter the optical modulation component 200. In the optical modulation component 200, a light valve, also known as an optical modulator, is a core component. In some examples of the present disclosure, the function of the optical modulator is to modulate the illumination beams output by the laser source 100 by using image signals. That is, the optical modulator is driven by driving signals corresponding to the image signals of the image to be displayed and modulates the illumination beams mainly by amplitude modulation. In some examples, the optical modulator may further perform spatial phase modulation, and the modulated beams enter the projection lens to finally form an optical image. Depending on whether the optical modulator (or the light valve) transmits or reflects the illumination beams, the optical modulator may be classified as a transmissive optical modulator or a reflective optical modulator. In an example of the present disclosure, the light valve is a digital micromirror device (DMD), which is a reflective light valve. In some embodiments, the projection lens 300 includes a refractive lens system. In some embodiments, the projection lens 300 further includes a reflector system. The projection lens 300 may be a telephoto lens or a short-focus lens. In some examples of the present disclosure, the laser projection apparatus is an ultra-short-focus laser projection apparatus, and the projection lens 300 is an ultra-short-focus projection lens.

In some examples of the present disclosure, the laser source 100 uses semiconductor laser devices as light-emitting devices. The semiconductor laser device includes a multi-chip encapsulating structure. Each semiconductor laser device of the laser source 100 may only emit laser beams of one color or may emit laser beams of two or three colors.

The laser device 10 in the laser source 100 according to some embodiments of the present disclosure will be described in detail below. Some embodiments of the present disclosure provide a laser device. FIG. 1 is an exploded view of a laser device, in accordance with some embodiments. As shown in FIG. 1, the laser device 10 includes a base plate 101, a frame 102, a plurality of light-emitting assemblies 103 (see FIG. 2 or 5), a cover plate 104, and a light transmitting layer 105. The frame 102 is disposed on the base plate 101 and forms an accommodating space. The plurality of light-emitting assemblies are located in the accommodating space and disposed on the base plate 101. An outer edge of the cover plate 104 is fixedly connected to a surface of the frame 102 away from the base plate 101, and an inner edge of the cover plate 104 is fixedly connected to the light transmitting layer 105. The accommodating space may be sealed through the light transmitting layer 105.

The laser device 10 further includes a plurality of conductive pins 106 electrically connected to the plurality of light-emitting assemblies 103. The frame 102 includes a plurality of flanging portions P and a plurality of flanging holes K. The flanging portion P is located at a side wall of the frame 102 and extends towards a direction proximate to the accommodating space or towards a direction away from the accommodating space. The plurality of flanging holes K correspond to the plurality of flanging portions P, and a flanging hole K runs through a corresponding flanging portion P along an extending direction of the corresponding flanging portion P. The conductive pin 106 extends through a corresponding flanging hole K and is electrically connected to an external power supply, so that the light-emitting assemblies 103 are excited to emit laser beams through the external power supply. The laser beams pass through the light transmitting layer 105, so as to implement the light-emission of the laser device 10. For example, a portion of any one of the plurality of conductive pins 106 is located at an outside of the accommodating space through a corresponding flanging hole K.

Figure 2:
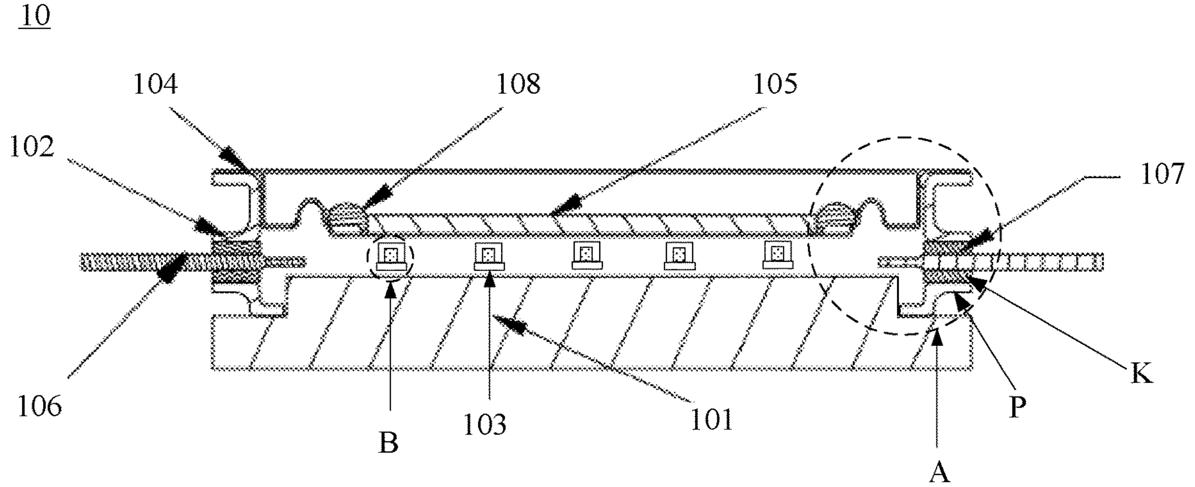
FIG. 2 is a sectional view of the laser device after being assembled shown in FIG. 1.

FIG. 2 is a sectional view of the laser device after being assembled, as shown in FIG. 1. As shown in FIGS. 1 and 2, in some embodiments, the base plate 101 is a plate-like structure and includes a middle portion 1011 and a peripheral portion 1012. A thickness of the middle portion 1011 is greater than a thickness of the peripheral portion 1012. The middle portion 1011 is configured to carry the plurality of light-emitting assemblies 103, and the peripheral portion 1012 is configured to carry the frame 102. A surface of the base plate 101 carrying the plurality of light-emitting assemblies 103 and the frame 102 is an inner surface, and a surface of the base plate 101 opposite to the inner surface is an outer surface. The outer surface is configured to come into contact with the heat dissipation structure for thermal conduction. The base plate 101 is made of a material with good thermal conductivity, such as oxygen-free copper. The oxygen-free copper has a large thermal conductivity, so that the heat generated by the plurality of light-emitting assemblies 103 disposed on the base plate 101 during operation may be quickly conducted to a heat dissipation structure outside the laser device 10, thereby dissipating heat quickly and avoiding a damage to the light-emitting assembly 103 caused by heat accumulation.

The frame 102 is plate-shaped and is fixedly connected to the peripheral portion 1012 of the base plate 101. As shown in FIG. 1, the frame 102 is in a shape of a square ring. In some embodiments, the frame 102 may be in a shape of a circular ring, a pentagonal ring, or other ring shapes. It will be noted that no matter what shape the frame 102 is, the frame is used to form the accommodating space with the base plate 101. The material of the frame 102 may include Kovar alloy. For example, iron-nickel-cobalt alloy or iron-nickel alloy.

Figure 3A:
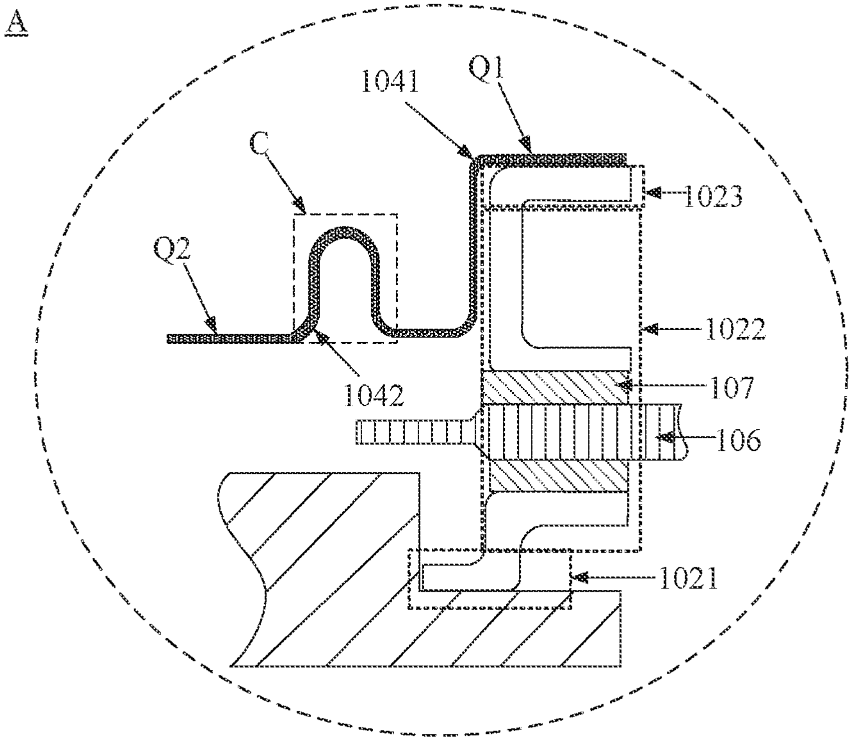
FIG. 3A is a partial enlarged view of the portion A in FIG. 2.

FIG. 3A is a partial enlarged view of the portion A in FIG. 2. As shown in FIG. 3A, the frame 102 includes a first flange 1021, a frame body 1022, and a second flange 1023 connected in sequence. The first flange 1021 and the second flange 1023 each are bent relative to the frame body 1022.

The lower portion of the frame 102 is bent towards the inside of the accommodating space to form the first flange 1021, and an upper portion of the frame 102 is bent towards the outside of the accommodating space to form the second flange 1023. In a case where the second flange 1023 is bent towards the outside of the accommodating space, the occupation of the accommodating space by the second flange 1023 may be avoided, thereby ensuring sufficient installation space for the plurality of light-emitting assemblies 103. However, the present disclosure is not limited thereto. In some embodiments, the lower portion of the frame 102 may be bent outwards to form the first flange 1021, and the lower portion of the frame 102 may be bent inwards to form the second flange 1023. The first flange 1021 and the second flange 1023 each may be bent inwards or outwards.

In some embodiments, the frame 102 is integrally formed and is a sheet metal member. In some embodiments, the frame 102 is formed by using a stamping process.

For example, a plate is stamped, so that the plate has bends, depressions, protrusions, or flanges to obtain the frame 102. For example, a side of the plate is bent to form the first flange 1021, and another opposite side of the plate is bent to form the second flange 1023. Then, the plate is bent into an annular shape, so that the first flange 1021 is bent towards the inside of the annular shape structure, and the second flange 1023 is bent towards the outside of the annular shape structure, so as to obtain the frame 102.

In addition, as will be introduced below, the frame body 1022 located between the first flange 1021 and the second flange 1023 may further be punched to form the flanging portions P and the flanging holes K (see FIG. 1 or 2) before bending the above-mentioned plate into an annular shape.

It will be noted that the order in which the first flange 1021, the second flange 1023, the flanging portions P, and the flanging hole K are made is not limited in the present disclosure. According to the process requirements, the flanging portions P and the flanging hole K may be made first, or the second flanging 1023 may be made first.

The thickness of each position of the frame 102 may be the same or substantially the same. For example, the thickness of each position of the first flange 1021, the frame body 1022, and the second flange 1023 of the frame 102 is substantially the same.

For example, the thickness of the frame 102 is in a range from 0.1 mm to 1 mm. The range of thickness may provide the frame with greater mechanical strength and satisfy stamping requirements. For example, the thickness of the frame 102 is 0.1 mm, 0.2 mm, 0.3 mm, 0.4 mm, 0.5 mm, 0.6 mm, 0.7 mm, 0.8 mm, 0.9 mm, or 1 mm, etc.

In some embodiments, surfaces of the first flange 1021 and the second flange 1023 proximate to the peripheral portion 1012 or away from the peripheral portion 1012 may be parallel to the inner surface of the base plate 101. The first flange 1021 may be disposed on the base plate 101. For example, a surface of the first flange 1021 proximate to the peripheral portion 1012 is fixed to the base plate 101.

In some embodiments, the frame 102 is fixed on the base plate 101 through brazing technology. For example, the solder is placed between the first flange 1021 of the frame 102 and the base plate 101, and then the solder is heated and melted, thereby fixing the frame 102 on the base plate 101.

It will be noted that when brazing, the base plate and the frame need to withstand a large amount of heat to be soldered together. The large amount of heat will generate significant thermal stress. If the thickness of the frame is large, the frame will not easily deform due to the action of the thermal stress, however, the base plate will easily wrinkle due to the action of the thermal stress, resulting in poor flatness of the inner surface of the base plate for arranging the plurality of light-emitting assemblies, thereby affecting the arrangement of the plurality of light-emitting assemblies. In addition, precision optical devices need to be mounted on the base plate to reflect, converge, or collimate the laser beams emitted by the plurality of light-emitting assemblies. If the flatness of the base plate changes, the light-emitting effect of the optical devices will be reduced.

In the laser device provided by some embodiments of the present disclosure, the frame 102 is a sheet metal member, and the thickness of the frame 102 is small. Therefore, the thermal stress generated during brazing may cause mechanical deformation of the frame 102, thereby preventing the base plate 101 from being wrinkled or deformed due to the action of thermal stress. For example, the frame 102 may be slightly deformed due to the action of the thermal stress to release the thermal stress, so as to prevent the base plate 101 from being wrinkled or deformed due to the action of the thermal stress, thereby improving the flatness of the base plate 101, the manufacturing effect of the laser device, and the light-emitting effect of the plurality of light-emitting assemblies 103 disposed on the base plate 101.

As described above, the laser device 10 further includes the plurality of conductive pins 106 electrically connected to the plurality of light-emitting assemblies 103. The plurality of conductive pins 106 need to pass through the frame 102 to be electrically connected to the external power supply. In a case where the thickness of the frame 102 is small, the contact area between the plurality of conductive pins 106 and the frame 102 is reduced, and as a result, the fixing reliability of the plurality of conductive pins 106 on the frame 102 may be reduced.

In view of this, as shown in FIG. 1, the frame body 1022 is provided with the plurality of flanging portions P and the plurality of flanging holes K. The flanging portion P may be in a tubular shape protruding relative to the frame body 1022, and a depth of the flanging hole K is greater than the thickness of the frame body 1022. The plurality of conductive pins 106 pass through the plurality of flanging holes K, respectively, and are fixed on the frame 102. The regions on the frame 102 fixed to the plurality of conductive pins 106 are inner walls of the flanging holes K.

It will be noted that the flanging portion and the flanging hole processing refers to the processing of turning over the periphery of the hole on the sheet metal member, so as to increase the inner diameter and depth of the hole. For example, a small hole may be made on the frame body 1022 first (for example, the small hole is punched out through a punching process, and a depth of the small hole is the thickness of the sheet metal member), and then a punch-pin is used to flange an edge of the small hole. For example, the edge portion of the small hole is stretched in a direction perpendicular to a plane where the frame body 1022 is located, so as to obtain the flanging hole K on the frame body 1022. The flanging hole K has a greater inner diameter and a greater depth compared with the initial small hole.

Since the depth of the flanging hole K is greater than that of the initial small hole, the area of the inner wall of the flanging hole K is greater than that of the initial small hole, That is, the fixed contact area between the conductive pin 106 and the frame 102 is large, so that the reliability of fixing the plurality of conductive pins 106 on the frame 102 may be improved. In addition, even if a certain position on the inner wall of the flanging hole K is not in close contact with the conductive pin 106, as long as other positions in the depth direction of the flanging hole K are in close contact with the conductive pin 106, the sealing between the flanging hole K and the conductive pin 106 may be implemented. Therefore, the sealing effect of the flanging hole and the airtightness of the accommodating space of the laser device are improved, thereby improving the preparation effect and quality of the laser device.

The leakage rate of the accommodating space of the laser device 10 provided by some embodiments of the present disclosure is less than or equal to $5\times10^{-9}$ Pa$\times$m$^3$/s. For example, the leakage rate of the accommodating space of the laser device 10 provided by some embodiments of the present disclosure may be $5\times10^{-9}$ Pa$\times$m$^3$/s, $4\times10^{-9}$ Pa$\times$m$^3$/s, $3\times10^{-9}$ Pa$\times$m$^3$/s, or $2\times10^{-9}$ Pa$\times$m$^3$/s.

The frame 102 has a plurality of the flanging portions P. Each flanging portion P may protrude towards the inside of the accommodating space. Alternatively, each flanging portion P may also protrude towards the outside of the accommodating space.

Alternatively, a part of the plurality of the flanging portions P protrudes towards the inside of the accommodating space, and another part of the flanging portions P protrudes towards the outside of the accommodating space. In a case where each flanging portion P protrudes towards the outside of the accommodating space, the occupation of each flanging portion P of the accommodating space may be avoided, so that the plurality of light-emitting assemblies 103 have sufficient space for installation.

The laser device 10 provided by some embodiments of the present disclosure may be a multi-chip laser diode (Ma) device. Therefore, the plurality of light-emitting assemblies 103 in the laser device 10 may include a plurality of rows and a plurality of columns of light-emitting chips arranged in an array.

In some embodiments, the laser device 10 is a single-color laser device, and all the light-emitting chips in the laser device 10 may emit laser beams of a same color. Alternatively, the laser device 10 may also be a multi-color laser device and may include a plurality of types of light-emitting chips. Each type of light-emitting chips is configured to emit laser beams of one color, and the laser beams emitted by different types of light-emitting chips are of different colors.

Figure 4:
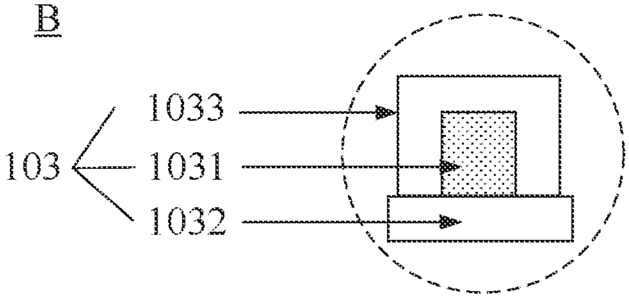
FIG. 4 is a partial enlarged view of the portion B in FIG. 2.

FIG. 4 is a partial enlarged view of the portion B in FIG. 2. As shown in FIG. 4, the light-emitting assembly 103 includes a light-emitting chip 1031, a heat sink 1032, and a reflecting prism 1033 (the same structure may also be seen in FIG. 6 or FIG. 9). The heat sink 1032 is fixed on the base plate 101, the light-emitting chip 1031 is fixed on the heat sink 1032, and the reflecting prism 1033 is located on a light exit side of the light-emitting chip 1031.

The light-emitting chip 1031 emits a laser beam to the reflecting prism 1033, and the reflecting prism 1033 reflects the incident laser beam in a direction away from the base plate 101. The laser beam may transmit through the light transmitting layer 105, so as to implement the light-emission of the laser device.

The heat sink 1032 is configured to assist in dissipating the heat generated by the light-emitting chip 1031 when the light-emitting chip 1031 emits light. The light-emitting chip 1031 generates a large amount of heat when emitting light, and the heat may be conducted to the base plate 101 through the heat sink 1032, and then dissipated to the outside of the laser device 10 (e.g., to the heat dissipation structure connected to the outer surface of the base plate 101), so as to avoid damage to the light-emitting chip 1031 caused by heat accumulation. The heat may also be conducted to the frame 102 through the base plate 101. In this case, the heat has the same effect on the frame 102 as the heat generated by brazing. The frame 102 may also undergo certain deformation due to the action of the heat to offset thermal stress and assist in the dissipation of the heat generated by the light-emitting chip 1031.

As shown in FIGS. 1 to 3A, the cover plate 104 includes an outer edge region Q1, an inner edge region Q2, and at least one wrinkle portion C located between the outer edge region Q1 and the inner edge region Q2. The inner edge region Q2 of the cover plate 104 defines an opening 1040, and the laser beams output by the plurality of light-emitting assemblies 103 pass through the opening 1040. The outer edge region Q1 of the cover plate 104 is fixed to the surface of the frame 102 away from the base plate 101. For example, the outer edge region Q1 is fixed to the second flange 1023 of the frame 102. The inner edge region Q2 of the cover plate 104 is fixed to the light transmitting layer 105.

The inner edge region Q2 is concave towards the base plate 101 relative to the outer edge region Q1. Both the outer edge region Q1 and the inner edge region Q2 may be annular plate-shaped structures with flat upper surfaces and lower surfaces, so as to facilitate the fixation of the cover plate 104 to the frame 102 and the light transmitting layer 105, respectively. A plane where the outer edge region Q1 is located may be parallel to a plane where the inner edge region Q2 is located.

The at least one wrinkle portion C may protrude from the inner edge region Q2 in a direction away from the base plate 101. Alternatively, the at least one wrinkle portion C may be recessed from the inner edge region Q2 towards the base plate 101.

As shown in FIG. 3A, the at least one wrinkle portion C includes one wrinkle portion C that protrudes from the inner edge region Q2 in a direction away from the base plate 101. When the parallel sealing is performed on the cover plate 104 and the frame 102, the cover plate 104 and the frame 102 will be thermally expanded, thereby generating large thermal stress. Due to the action of the thermal stress, the wrinkle portion C will be compressed by the inner edge region Q2 and the outer edge region Q1. In this case, the wrinkle portion C may play a role similar to a spring and undergo contraction deformation under compression. In this way, the wrinkle portion C may absorb more stress to play a certain buffering role. Therefore, the stress transmitted to the light transmitting layer 105 is small.

Although the cover plate 104 shown in FIG. 3A only has one wrinkle portion C, this should not be construed as a limitation of the present disclosure.

Figure 3B:
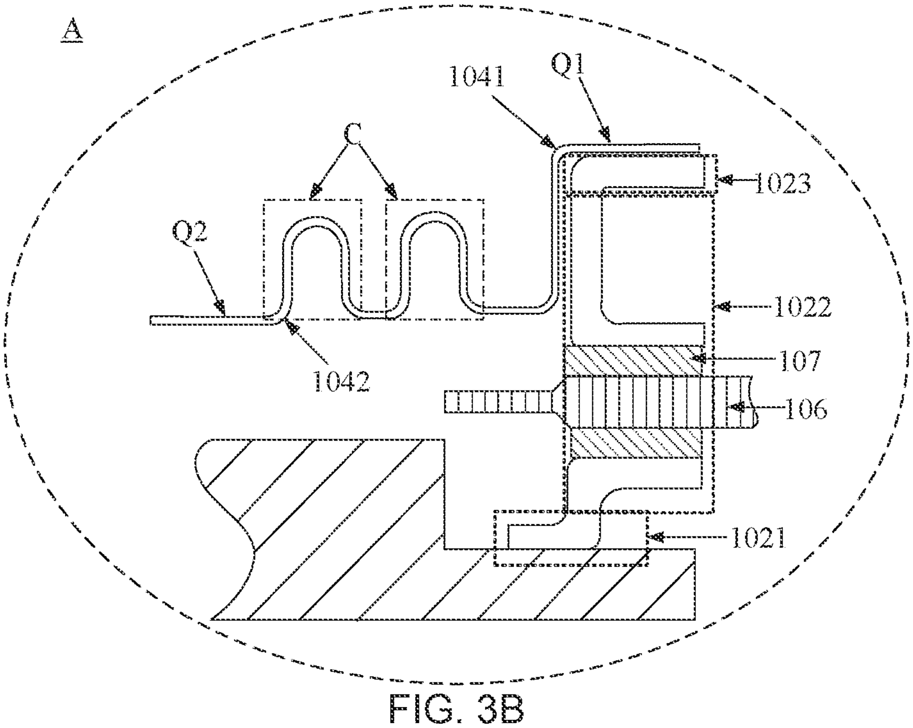
FIG. 3B is another partial enlarged view of the portion A, in accordance with some embodiments.

As shown in FIG. 3B, in some embodiments, the at least one wrinkle portion C includes two wrinkle portions C arranged along the direction from the inner edge region Q2 to the outer edge region Q1 in sequence. The two wrinkle portions C each protrude from the inner edge region Q2 in a direction away from the base plate 101. The two wrinkle portions C absorb more stress than one wrinkle portion C and play a stronger buffering role. Therefore, the stress transmitted to the light transmitting layer 105 is less.

Figure 3C:
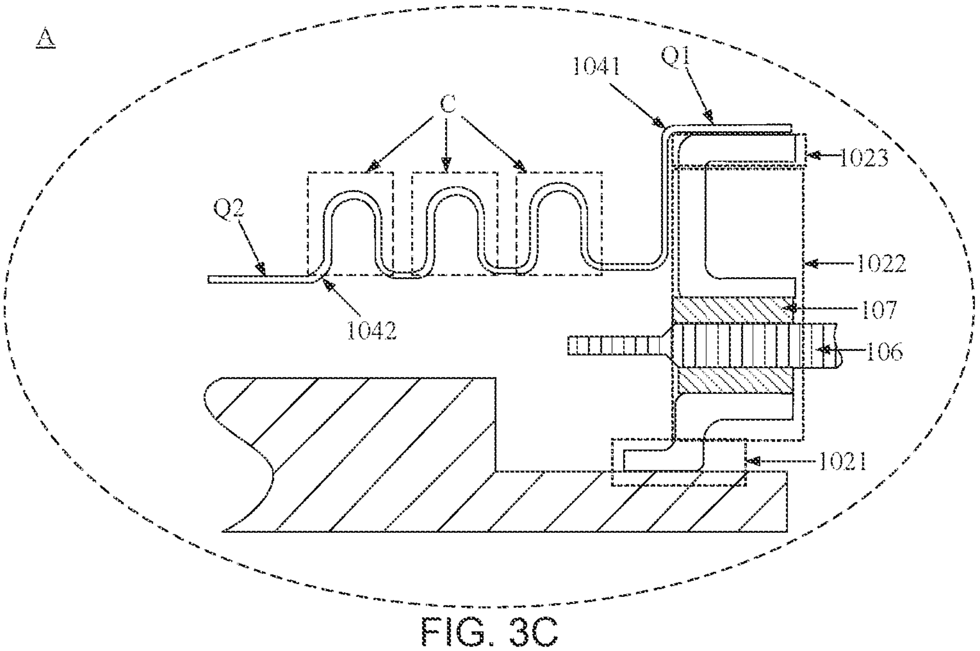
FIG. 3C is yet another partial enlarged view of the portion A, in accordance with some embodiments.

As shown in FIG. 3C, in some embodiments, the at least one wrinkle portion C includes three wrinkle portions C arranged along the direction from the inner edge region Q2 to the outer edge region Q1 in sequence. The three wrinkle portions C each protrude from the inner edge region Q2 in a direction away from the base plate 101. The three wrinkle portions C absorb more stress than one wrinkle portion C or two wrinkle portions C and play a stronger buffering role. Therefore, the stress transmitted to the light transmitting layer 105 is even less.

As shown in FIGS. 3B and 30, in the case where the at least one wrinkle portion C includes a plurality (two or more) of wrinkle portions C, the plurality of wrinkle portions C are arranged along the direction from the inner edge region Q2 to the outer edge region Q1 in sequence.

In the case where the cover plate 104 has the plurality of wrinkle portions C, a cross-section of the plurality of wrinkle portions C may be in a shape of a wave, and there is an interval between every two adjacent wrinkle portions. The wrinkle portion C protrudes from the inner edge region Q2 in a direction away from the base plate 101. Alternatively, the wrinkle portion C is recessed from the inner edge region Q2 towards the base plate 101.

It will be noted that some embodiments of the present disclosure are not limited thereto. In the case where the cover plate 104 has a plurality of wrinkle portions C, a part of the plurality of wrinkle portions C protrude from the inner edge region Q2 towards the direction away from the base plate 101, and another part of the plurality of wrinkle portions C is recessed from the inner edge region Q2 towards the base plate 101. In some embodiments, the wrinkle portions C that protrude from the inner edge region Q2 in the direction away from the base plate 101 and the wrinkle portions C that are recessed from the inner edge region Q2 towards the base plate 101 are alternately arranged.

In some embodiments, the wrinkle portion C is in a shape of a tooth. For example, the wrinkle portion C is in a shape of an arc tooth, a pointed tooth, or a square tooth.

In some embodiments, the cover plate 104 further includes an outer curved connecting portion 1041 and an inner curved connecting portion 1042. The outer curved connecting portion 1041 is connected to the outer edge region Q1 and the at least one wrinkle portion C. The stress generated by the outer edge region Q1 may be transmitted to the at least one wrinkle portion C through the outer curved connecting portion 1041. The outer curved connecting portion 1041 may also undergo a certain deformation along its own bending direction due to the action of the above-mentioned stress to absorb a part of the stress, thereby reducing the stress transmitted to the at least one wrinkle portion C.

The inner curved connecting portion 1042 is connected to the inner edge region Q2 and the at least one wrinkle portion C. The stress generated by the inner edge region Q2 may be transmitted to the at least one wrinkle portion C through the inner curved connecting portion 1042. The inner curved connecting portion 1042 may also undergo a certain deformation along its own bending direction due to the action of the above-mentioned stress to absorb a part of the stress, thereby reducing the stress transmitted to the at least one wrinkle portion C.

In some embodiments, the outer curved connecting portion 1041 or the inner curved connecting portion 1042 includes chamfers or rounded corners, so as to avoid excessive concentration of stress at the outer curved connecting portion 1041 or the inner curved connecting portion 1042, which may cause damage to the outer curved connecting portion 1041 or the inner curved connection 1042.

In some embodiments, the cover plate 104 is a sheet metal member, and a thickness of the cover plate 104 at each position is the same or substantially the same.

The cover plate 104 may be formed by a stamping process. For example, an annular plate may be stamped, so that the annular plate has bends, depressions, or protrusions, thereby forming the outer edge region Q1, the inner edge region Q2, and the at least one wrinkle portion C. In this way, the cover plate 104 provided by some embodiments of the present disclosure is obtained.

In some embodiments, the material of the cover plate 104 is the same as that of the frame 102. In this way, when the parallel sealing is performed on the cover plate 104 and the frame 102, a heated region of the cover plate 104 and a heated region of the frame 102 may be directly melted into one body without any interaction that may cause deformation of the cover plate 104 or the frame 102. In this way, the fixing effect between the cover plate 104 and the frame 102 is good, and the sealing effect of the accommodating space of the laser device 10 is good.

The material of the cover plate 104 may include Kovar alloy. For example, iron-nickel-cobalt alloy or iron-nickel alloy.

As shown in FIGS. 1 and 2, the light transmitting layer 105 is sealed and fixed to the inner edge region Q2 of the cover plate 104. The light transmitting layer 105 may have a plate-like structure. The light transmitting layer 105 may cover the opening 1040 of the cover plate 104 and be fixed to the cover plate 104. The light transmitting layer 105 may be made of a transparent material, such as glass, resin, etc.

In some embodiments, a brightness enhancement film is provided on (e.g., attached to) at least one of a surface of the light transmitting layer 105 proximate to the base plate and a surface of the light transmitting layer 105 away from the base plate, so as to improve the light-emitting brightness of the laser device 10.

In some embodiments, the light transmitting layer 105 and the cover plate 104 are first fixed, and then the cover plate 104 and the frame 102 are fixed together through parallel sealing. When the parallel sealing is performed on the cover plate 104 and the frame 102, the cover plate 104 and the frame 102 will be thermally expanded, thereby generating large thermal stress. Due to the action of the thermal stress, the at least one wrinkle portion C of the cover plate 104 will be compressed by the inner edge region Q2 and the outer edge region Q1. In this case, each wrinkle portion C may undergo contraction deformation similar to a compression spring. In this way, the at least one wrinkle portion C may absorb more stress to play a certain buffering role. Therefore, the stress transmitted to the light transmitting layer 105 is small.

It can be understood that in a case where the cover plate 104 is heated and expands towards the light transmitting layer 105, the at least one wrinkle portion C may shrink to a certain extent due to the action of thermal stress. Therefore, the cover plate 104 expands due to heating, and the deformation generated by the cover plate 104 towards the light transmitting layer 105 is relatively small. In this way, the cover plate 104 exerts less pressure on the light transmitting layer 105, thereby reducing the risk of the light transmitting layer 105 breaking when the parallel sealing is performed on the cover plate 104 and the frame 102.

In addition, since the at least one wrinkle portion C may absorb a large amount of thermal stress, a limit value of the force applied on the cover plate 104 may be increased, the adaptability of the cover plate 104 and the light transmitting layer 105 to a high parallel sealing temperature may be enhanced, and requirements on manufacturing conditions of the laser device 10 may be reduced. Moreover, environmental requirements for the use of the laser device 10 may be reduced, and a scope of the application of the laser device 10 may be expanded.

After the parallel sealing is completed and the cover plate 104 is no longer heated, the temperature of the frame 102 and the cover plate 104 decreases, and then the at least one wrinkle portion C may be restored to an original state (that is, a shape without being compressed by the inner edge region Q2 and outer edge region Q1).

As shown in FIGS. 1, 2, and 3A, the laser device 10 further includes a plurality of annular insulators 107 configured to fix a conductive pin 106 in a corresponding flanging hole K.

The conductive pin 106 may be inserted into an annular insulator 107 and then be inserted into the flanging hole K. That is, in a case where the conductive pin 106 is located in the flanging hole K, the annular sealing insulator 107 is located between the conductive pin 106 and the inner wall of the flanging hole K.

In some embodiments, the annular insulator 107 is in a tubular shape. A length of the annular insulator 107 may be equal to the depth of the flanging hole K. Alternatively, the length of the annular insulator 107 may be slightly less than or slightly greater than the depth of the flanging hole K.

After the conductive pin 106 sleeved with the annular insulator 107 is inserted into the flanging hole K, the annular insulator 107 may be heated. For example, the annular insulator 107 is heated to a temperature from 800° C. to 900° C., inclusive, so as to cause the annular insulator 107 to melt, thereby filling a gap between the conductive pin 106 and the inner wall of the flanging hole K, so as to achieve the sealing of the gap.

The melted annular insulator 107 may be used as a sealing adhesive to bond the conductive pin 106 and the inner wall of the flanging hole K, and then the annular insulator 107 is cooled and solidified. In this way, not only the conductive pins 106 and the frame 102 are fixed, but also the sealing between the conductive pins 106 and the corresponding flanging hole K is achieved.

In some embodiments, the material of the annular insulator 107 includes glass. It will be noted that the bonding effect between the glass and the Kovar alloy is good at high temperatures. The laser device 10 provided in some embodiments of the present disclosure uses Kovar alloy to manufacture the frame 102, and uses glass to manufacture the annular insulator 107, so that the annular insulator 107 may be well fused with the flanging hole K after melting, and the sealing effect on the flanging hole is improved.

In some embodiments, a structure consisting of the base plate 101 and the frame 102 may be referred to as a shell 140 or a base assembly. A structure consisting of the cover plate 104 and the light transmitting layer 105 may be referred to as an upper cover assembly. As shown in FIG. 1, in some embodiments, the shell has an opening opposite the base plate 101, and the upper cover assembly is configured to seal the opening. The shell, the cover plate 104, and the light transmitting layer 105 may form a closed accommodating space, in which the plurality of light-emitting assemblies 103 are located. In some embodiments, a structure consisting of the base plate 101, the frame 102, and the conductive pins 106 may also be referred to as the shell 140 or the base assembly.

The light-emitting chip 1031 of the light-emitting assembly 103 may be a semiconductor chip. The semiconductor chip is highly sensitive to moisture, harmful gases, and pollutants in the environment and is more susceptible to damage. For example, if particles such as dust, water vapor, or ionic pollutants enter the interior of the laser device 10 and adhere to the surface of the light-emitting chip 1031, as a result, it may cause a short circuit or an open circuit in the light-emitting chip 1031, eventually leading to the failure of the light-emitting chip 1031. Therefore, the light-emitting chip 1031 needs to be airtightly encapsulated to isolate the light-emitting chip 1031 from the environment, so as to ensure the cleanliness of the light-emitting chip 1031 and prevent the light-emitting chip 1031 from being damaged by external substances.

The better the sealing effect of the accommodating space, the less the light-emitting assembly 103 will be corroded by external water and oxygen, so that the risk of damage to the light-emitting assembly 103 may be reduced, the service life of the light-emitting assembly 103 may be extended, the stability of the light-emitting effect of the light-emitting assembly 103 may be improved, the quality and use effect of the laser device 10 may be improved, and the service life of the laser device 10 may be extended.

As shown in FIGS. 2 and 3A, in some embodiments, a plurality of conductive pins 106 are symmetrically distributed on two sides of the frame 102. Portions of the plurality of conductive pins 106 fixed on two sides of the frame 102 that are located outside the frame 102 are electrically connected to the positive and negative electrodes of the external power supply. Portions of the plurality of conductive pins 106 extending into the frame 102 are electrically connected to the electrodes of the corresponding light-emitting chips 1031, respectively, so as to transmit an external current to each light-emitting chip 1031 (see FIG. 4), thereby exciting the plurality of light-emitting chips 1031 to emit laser beams of corresponding colors.

In some embodiments, after the base plate 101, the frame 102, and the conductive pins 106 are assembled, that is, after the base assembly is obtained, each light-emitting assembly 103 may be mounted on the base plate 101. Then, wire bonding is performed on each conductive pin 106 and the corresponding light-emitting chip 1031, so that the electrode of each light-emitting chip 1031 is electrically connected to the corresponding conductive pin 106.

As shown in FIG. 1, the upper cover assembly may further include a sealing member 108, through which the light transmitting layer 105 and the cover plate 104 may be fixed.

The sealing member 108 may include a low temperature glass solder. Alternatively, the sealing member 108 may include glass melt glue, epoxy sealant, or other sealing glue.

In some embodiments, an edge region of the light transmitting layer 105 may be in contact with the inner edge region Q2 of the cover plate 104, and the sealing member 108 may cover the side of the light transmitting layer 105, so as to improve the sticking reliability of the light transmitting layer 105 and improve the sealing reliability of the accommodating space of the laser device 10 by the light transmitting layer 105.

For example, the light transmitting layer 105 and the sealing member 108 each may be placed on the cover plate 104, and the light transmitting layer 105 covers the opening 1040 of the cover plate 104. The sealing member 108 is located between the light transmitting layer 105 and the cover plate 104 and extends from the side of the light transmitting layer 105. The sealing member 108 is then heated to melt, so as to fill the gap between the light transmitting layer 105 and the cover plate 104, thereby fixing the light transmitting layer 105 and the cover plate 104.

In some embodiments, the light transmitting layer 105 and the cover plate 104 may be first fixed through the sealing member 108 to obtain the upper cover assembly. After that, the upper cover assembly and the shell are fixed. For example, the parallel sealing technology is used to fix the cover plate 104 of the upper cover assembly and the frame 102.

For example, the upper cover assembly may be placed on a side of the frame 102 away from the base plate 101, and the outer edge region Q1 of the cover plate 104 overlaps the second flange 1023 of the frame 102. After that, the outer edge region Q1 and the second flange 1023 are heated by a sealing device, so that a portion where the outer edge region Q1 is in contact with the second flange 1023 is melted, thereby fixing the outer edge region Q1 and the second flange 1023 through soldering.

Figure 5:
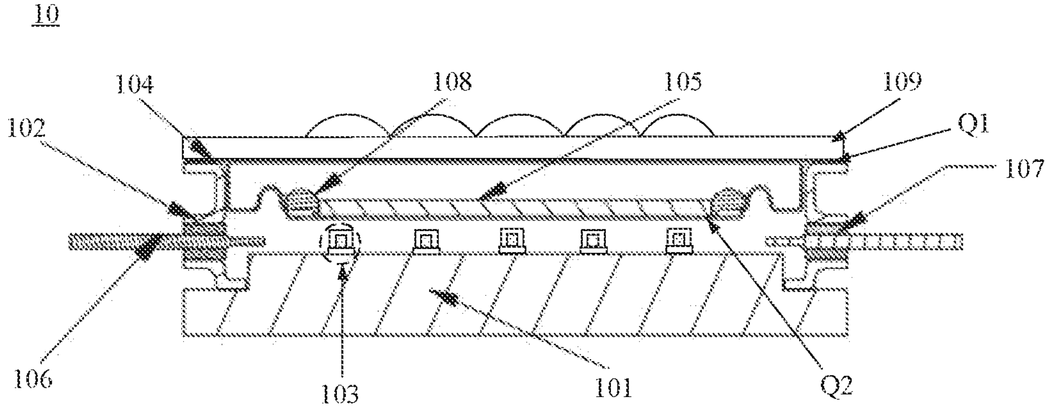
FIG. 5 is a structural diagram of another laser device, in accordance with some embodiments.

FIG. 5 is a structural diagram of another laser device, in accordance with some embodiments. In some embodiments, as shown in FIG. 5, on the basis of FIG. 2, the laser device 10 further includes a collimating lens group 109 located at a side of the upper cover assembly away from the base plate 101. For example, an edge of the collimating lens group 109 is fixed to the outer edge region Q1 of the cover plate 104.

The collimating lens group 109 is configured to collimate and propagate the laser beams emitted by the plurality of light-emitting assemblies 103. The collimating lens group 109 includes a plurality of collimating lenses corresponding to the plurality of light-emitting assemblies 103. The laser beam emitted by the light-emitting assembly 103 is directed to a corresponding collimating lens and is then exit after being collimated by the collimating lens.

It will be noted that collimating a beam refers to converging a divergent beam, so that a divergence angle of the beam becomes smaller and the beam is more approximate to a parallel beam.

In some embodiments, after the base assembly and the upper cover assembly are assembled, the collimating lens group 109 may be placed (e.g., suspended) on the side of the cover plate 104 away from the base plate 101 to adjust the collimating effect of the laser beams emitted by the light-emitting assembly 103.

In a case where the position of the collimating lens group 109 may ensure that the laser beams emitted by the light-emitting assemblies 103 pass through the corresponding collimating lens, adhesive is applied on the outer edge region Q1 of the cover plate 104, thereby fixing the collimating lens group 109 and the cover plate 104 through the adhesive.

In some embodiments, the adhesive includes epoxy sealant or other sealing glue.

Since the position of the collimating lens group 109 may be adjusted, even if the frame 102 is slightly deformed due to the heat generated during brazing or parallel sealing, it is possible to reduce or eliminate an effect on emission of laser beams of the plurality of light-emitting assemblies 103 when the frame 102 is deformed by adjusting the position of the collimating lens group 109, so as to realize normal emission of laser beams of the laser device 10.

The plurality of collimating lenses in the collimating lens group 109 are integrally formed. For example, a side of the collimating lens group 109 away from the base plate 101 is provided with a plurality of convex arc surfaces bent towards a side away from the base plate 101. A portion where each convex arc surface is located may serve as a collimating lens. Therefore, the collimating lens group 109 may include the plurality of collimating lenses.

The collimating lens may be a plano-convex lens. The collimating lens may have a convex arc surface and a flat surface, and the convex arc surface and the flat surface may be two opposite surfaces. The flat surface may be parallel to the inner surface or the outer surface of the base plate 101 and is disposed proximate to the base plate 101. Each convex arc surface contained in the collimating lens group 109 may serve as a convex arc surface in a collimating lens.

In some embodiments, when assembling the laser device, each annular insulator 107 is firstly sleeved on the corresponding conductive pin 106, and then the conductive pins 106 sleeved with the annular insulator 107 are inserted into the flanging holes K of the frame 102, and the annular insulator 107 is located in the flanged hole K.

After that, the frame 102 is placed on the base plate 101, and solder (e.g., silver-copper solder) is placed between the frame 102 and the base plate 101. Then, the structure consisting of the base plate 101, the frame 102, and the conductive pins 106 is placed in a high-temperature furnace for sealing and sintering. After being sealed, sintered, and solidified, the base plate 101, the frame 102, and the conductive pins 106 may form an entire structure (i.e., the base assembly), and the airtightness of the flanging holes K of the frame 102 may be achieved.

Then, the plurality of light-emitting assemblies 103 may be soldered at corresponding positions on the base plate 101. The light transmitting layer 105 and the cover plate 104 may further be fixed with a sealing material to obtain the upper cover assembly, and then the upper cover assembly may be soldered to the surface of the frame 102 away from the base plate 101 by using parallel sealing technology.

After aligning the position of the collimating lens group 109, the collimating lens group 109 is fixed on the side of the upper cover assembly away from the base plate 101 through epoxy sealant, thus the light-emitting chip 103 is assembled.

It will be noted that the above assembly process is only an exemplary process provided by some embodiments of the present disclosure. The soldering process used in each step may also be replaced by other processes, and the sequence of each step may also be adjusted accordingly, which is not limited in the embodiments of the present disclosure.

Figure 6:
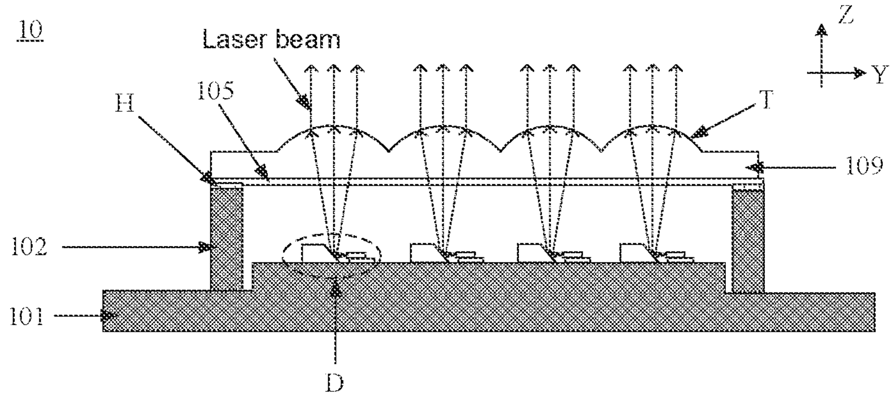
FIG. 6 is a structural diagram of yet another laser device, in accordance with some embodiments.
Figure 7:
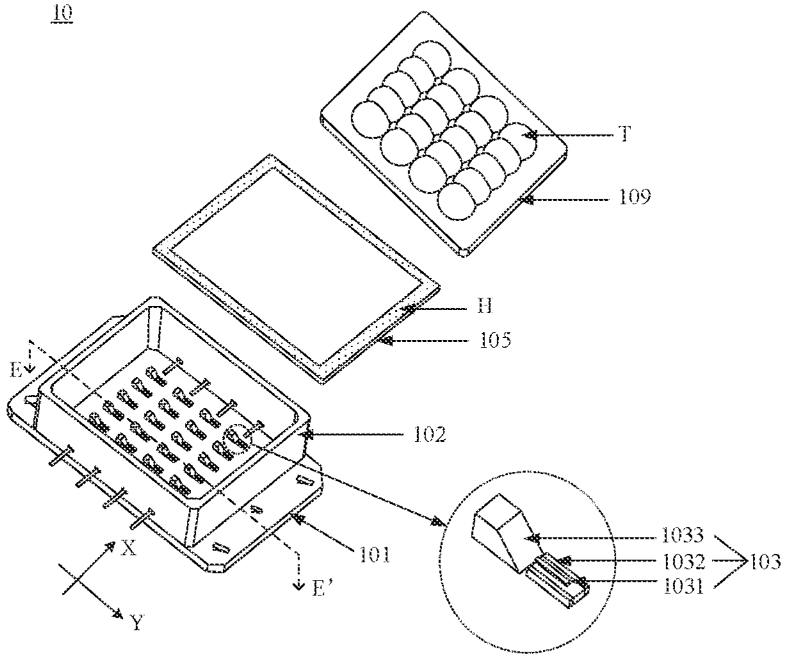
FIG. 7 is an exploded view of yet another laser device, in accordance with some embodiments.

FIG. 6 is a structural diagram of yet another laser device, in accordance with some embodiments; FIG. 7 is an exploded view of yet another laser device, in accordance with some embodiments. FIG. 6 may be a cross-sectional view of the laser device taken along the line E-E' as shown in FIG. 7. Only differences between the laser device shown in FIGS. 6 and 7 and the laser device shown in FIG. 5 will be described below, and their similarities will not be repeated herein. It will be noted that, components shown in FIGS. 6 and 7 that are the same as the components in the laser device shown in FIG. 5 are represented by the same reference numerals as those shown in FIG. 5. In some embodiments, as shown in FIGS. 6 and 7, the laser device 10 omits the cover plate 104. That is, the laser device 10 is not provided with the cover plate 104, and the light transmitting layer 105 is fixedly connected to the shell, directly.

It will be noted that the base plate 101 and the frame 102 of the shell may be a one-piece structure or may be structures independent from each other. For example, the base plate 101 and the frame 102 are fixedly connected through soldering to form the shell.

In the laser device shown in FIG. 5, the cover plate 104 and the light transmitting layer 105 form the upper cover assembly. The upper cover assembly and the shell are fixed together by parallel sealing. When performing parallel sealing, two objects to be sealed are stacked together, and the sealing device rolls on surfaces of the two stacked objects to be sealed to apply heat to the two objects to be sealed, so that the contact surfaces of the two objects to be sealed are melted due to the action of heat, thereby fixing the two objects to be sealed and soldered together.

Process parameters of the parallel sealing mainly include soldering current and soldering speed. The greater the soldering current, the greater the heat generated by the sealing device. The slower the soldering speed, the more heat the object to be sealed receives.

If the soldering current is too small, the soldering points may not be formed between the objects to be sealed, which will affect the sealing between the objects to be sealed. If the soldering current is too high, the heat impact on the object to be sealed will be too large, which may cause the object to be sealed to be burned. If the soldering speed is too low, the soldering time will be extended and the soldering heat will increase, thus causing the object to be sealed to deform, thereby resulting in uneven sealing trajectory. If the soldering speed is too high, the sealing trajectory will be discontinuous, affecting the sealing between the objects to be sealed. Therefore, the control of the parallel sealing is difficult.

In addition, as mentioned above, when the cover plate 104 is used, in some embodiments, the inner edge region Q2 of the cover plate 104 is bonded to the light transmitting layer 105 through the sealing member 108. The sealing member 108 may include low-temperature glass solder. Alternatively, the sealing member 108 may include glass melt glue, epoxy sealant, or other sealant. The sealing member 108 may generate bubbles during the low-temperature sintering process, which may cause air leakage in the accommodating space.

However, this does not mean that the structure of the laser device 10 shown in FIG. 5 should be abandoned. For example, it can be seen from the above description that the cover plate 104 includes the at least one wrinkle portion C, which may absorb a certain amount of stress during the parallel sealing process. Therefore, the laser device 10 shown in FIG. 5 is also intended to be protected by the present disclosure.

The laser device 10 shown in FIGS. 6 and 7 omits the cover plate 104, so that the light transmitting layer 105 is directly soldered to the shell through solder. In this way, compared with parallel sealing, the manner of soldering through solder is simple to operate and has high sealing reliability. It may ensure the sealing requirements of the accommodating space and does not need to consider complex soldering parameters, which may simplify the process of encapsulating the laser device 10. Since the cover plate 104 is omitted, there is no need to use the sealing member 108 to fix the cover plate 104 and the light transmitting layer 105, thus avoiding air leakage in the accommodating space. In addition, since the cover plate 104 is omitted, the volume of the laser device 10 is also reduced, which is conducive to implementing the miniaturization and thinness of the laser device 10.

The shape and size of the light transmitting layer 105 are adapted to the shape and size of the shell. For example, the length of the light transmitting layer 105 is in a range from 17.05 mm to 17.35 mm, such as 17.05 mm, 17.10 mm, 17.15 mm, 17.20 mm, 17.25 mm, 17.30 mm, or 17.35 mm. The width of the light transmitting layer 105 is in a range from 11.15 mm to 11.45 mm, such as 11.15 mm, 11.20 mm, 11.25 mm, 11.30 mm, 11.35 mm, 11.40 mm, or 11.45 mm. The thickness of the light transmitting layer 105 is in a range from 0.65 mm to 0.75 mm, such as 0.65 mm, 0.70 mm, or 0.75 mm.

When the opening of the shell is sealed through the light transmitting layer 105, the light transmitting layer 105 further needs to have sufficient hardness and strength to protect components (e.g., the plurality of light-emitting assemblies 103) within the shell. In addition, the laser beams emitted by the plurality of light-emitting assemblies 103 need to exit through the light transmitting layer 105. Therefore, the light transmittance of the light transmitting layer 105 needs to be large. For example, Mohs' scale of hardness of the light transmitting layer 105 needs to be greater than or equal to 9, such as 9 or 10, and/or the light transmittance of the light transmitting layer 105 needs to be greater than or equal to 85%, such as 85%, 88%, 90%, or 95%.

For example, the light transmitting layer 105 is made of sapphire. Mohs' scale of hardness of the sapphire is as high as 9.0, the light transmittance of the sapphire is greater than 85%, and the sapphire has high transmittance for light in the visible and the infrared bands.

An edge of a surface of the light transmitting layer 105 may be provided with a solder layer H, and the region where the solder layer H is provided may be an annular region.

The solder layer H in the light transmitting layer 105 is located on a surface of the light transmitting layer 105 proximate to the base plate 101. In FIG. 7, for convenience of illustration, the surface of the light transmitting layer 105 away from the base plate 101 is placed upwards. The light transmitting layer 105 may be fixed to the surface of the frame 102 away from the base plate 101 through the solder layer H. The light transmitting layer 105 is configured to seal the opening of the shell, so that the base plate 101, the frame 102, and the light transmitting layer 105 may form the sealed accommodating space. The plurality of light-emitting assemblies 103 may be located in the closed space, so as to avoid water and oxygen erosion from the outside and improve the reliability of the plurality of light-emitting assemblies 103.

It will be noted that when the supplier provides the light transmitting layer 105, the light transmitting layer 105 may be provided with the solder layer H. That is, the solder layer H is prepositioned on the light transmitting layer 105. In some embodiments, when manufacturing the laser device 10, the solder layer H may be disposed on the light transmitting layer 105.

The material of the solder layer H may include gold and tin. For example, the solder layer H may be a gold-tin solder layer. The gold content (weight) in the gold-tin solder layer may account for 80%, and the tin content (weight) may account for 20%. Gold-fin solder has high corrosion resistance, high creep resistance, and good thermal and electrical conductivity.

For example, the thermal conductivity of the gold-tin solder may reach 57 W/m'K. Therefore, soldering strength of the objects soldered with the gold-tin solder is high, the process of soldering with the gold-tin solder has good controllability, and the yield of soldering with gold-tin solder is high.

For example, the solder layer H may include a platinum layer and a gold-tin alloy layer sequentially stacked along the edge of the light transmitting layer 105 in a direction away from the light transmitting layer 105.

It will be noted that it is difficult for gold to be directly attached to the light transmitting layer 105. Therefore, the light transmitting layer 105 may be provided with a thin platinum layer first, and then the gold-tin alloy is coated on the platinum layer, so as to ensure the attaching firmness of the gold-tin alloy layer.

For example, a thickness of the platinum layer is in a range from 0.2 μm to 0.3 μm. For example, the thickness of the platinum layer is 0.2 μm, 0.22 μm, 0.25 μm, 0.28 μm, or 0.3 μm. A thickness of the gold-tin alloy layer is in a range from 2 μm to 3 μm. For example, the thickness of the gold-tin alloy layer is 2 μm, 2.2 μm, 2.5 μm, 2.8 μm, or a μm.

The platinum layer and the gold-tin alloy layer in the solder layer H each are in an annular shape, and the shapes and sizes of the platinum layer and the gold-tin alloy layer may be the same. For example, a width of the solder layer H is in a range from 1 mm to 1.5 mm. That is, the width of the solder layer H is greater than or equal to 1 mm and less than or equal to 1.5 mm. For example, the width of the solder layer H is 1 mm, 1.1 mm, 1.2 mm, 1.3 mm, 1.4 mm, or 1.5 mm. The widths of the platinum layer and the gold-tin alloy layer in the solder layer H each may also be in a range from 1 mm to 1.5 mm, inclusive.

For example, the width of each position of the solder layer H is the same. Alternatively, the widths of different positions of the solder layer H may be different from each other. In this case, the width of each position of the solder layer H may still be located in the above-mentioned width range of the solder layer H.

It will be noted that when using the solder layer H to solder two objects, the greater the contact area of the two objects through the solder layer H, the higher the soldering firmness of the two objects. In some embodiments, the light transmitting layer 105 and the frame 102 are fixed through the annular solder layer H on the edge of the light transmitting layer 105. Since the solder layer H on the light transmitting layer 105 is prepositioned, the greater the contact area between the solder layer H and the frame 102, the better the fixing effect between the light transmitting layer 105 and the frame 102.

For example, the width of the second flange 1023 of the frame 102 away from the base plate 101 is greater than the width of the solder layer H of the light transmitting layer 105, so as to ensure that the solder layer H may be in full contact with the frame 102 in a case where the light transmitting layer 105 is disposed on the second flange 1023 of the frame 102 away from the base plate 101. For example, the width at each position of the second flange 1023 of the frame 102 is the same. For example, the width of the second flange 1023 is greater than 1.5 mm, such as 1.6 mm, 1.7 mm, 1.8 mm, 2 mm, or 3 mm.

In some embodiments, in order to improve the sealing effect between the light transmitting layer 105 and the frame 102, the surface of the edge of the light transmitting layer 105 provided with the solder layer H and the surface of the second flange of the frame 102 each have a high flatness, so as to avoid sealing failure due to uneven defects on the surface of the edge of the light transmitting layer 105 or the surface of the second flange 1023.

For example, the flatness of the surface of the second flange 1023 may be less than or equal to 0.2 mm That is, a distance between a most concave point and a most convex point on the surface of the second flange 1023 in a direction perpendicular to the surface is less than or equal to 0.2 mm.

For example, the annular surface of the second flange 1023 may be provided with a gold layer. For example, the annular surface of the second flange 1023 is pre-coated with the gold layer.

Since the majority of the components of the gold-tin solder layer are gold, after heating the light transmitting layer 105, the gold-tin solder layer on the light transmitting layer 105 may fuse with the gold layer on the frame 102, so as to well integrate into one body. Furthermore, the soldering firmness of the light transmitting layer 105 and the second flange 1023 may be improved.

The gold-tin solder has good wettability and does not corrode the gold layer. Since the composition of the gold-tin alloy layer is close to that of the gold layer, the gold tin alloy layer has a low degree of immersion in the gold layer through diffusion, thereby avoiding the impact of the soldering process on original characteristics of the light transmitting layer 105 and the frame 102.

It will be noted that, in order to simplify the drawings, the first flange 1021 and the second flange 1023 of the frame 102 are not shown in FIGS. 6 and 7. Moreover, in some embodiments, the first flange 1021 and the second flange 1023 of the frame 102 are not essential.

When manufacturing the laser device 10 shown in FIGS. 6 and 7, the base plate 101 and the frame 102 may be soldered first, and then the plurality of light-emitting assemblies 103 are mounted on the base plate 101.

After that, the light transmitting layer 105 provided with the solder layer H may be disposed at the side of the frame 102 away from the base plate 101, and the solder layer H is in contact with the surface of the frame 102 away from the base plate 101.

Then, the edge of the light transmitting layer 105 is heated to melt the solder in the solder layer H, and then the melted solder layer H is solidified to obtain the assembled laser device 10.

For example, after the base plate 101 and the frame 102 are soldered, the edge of the light transmitting layer 105 may be heated first, so as to melt the solder in the solder layer H provided on the light transmitting layer 105. Then, the light transmitting layer 105 attached with the melted solder layer H is disposed at the side of the frame 102 away from the base plate 101, and the solder layer H is in contact with the surface of the frame 102 away from the base plate 101. Finally, the melted solder layer H is solidified to obtain the assembled laser device.

As shown in FIGS. 6 and 7, in some embodiments, the plurality of light-emitting assemblies 102 in the laser device 10 are arranged in a plurality of rows and a plurality of columns. In FIG. 7, considering an example in which the laser device 10 includes twenty light-emitting assemblies 103 arranged in four rows and five columns, where a row direction is an X direction, and a column direction is a Y direction.

Figure 8:
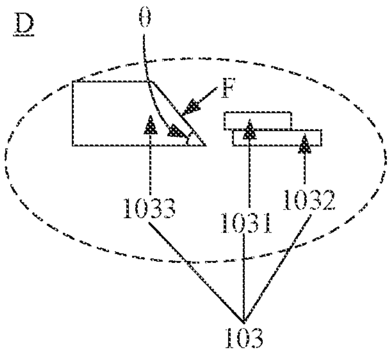
FIG. 8 is a partial enlarged view of the portion D in FIG. 6.

FIG. 8 is a partial enlarged view of the portion D in FIG. 6. As shown in FIG. 8, the light-emitting assembly 103 includes a light-emitting chip 1031, a heat sink 1032, and a reflecting prism 1033. The heat sink 1032 and the reflecting prism 1033 are fixed on the base plate 101, the light-emitting chip 1031 is fixed on the heat sink 1032, and the reflecting prism 1033 is located at a light exit side of the light-emitting chip 1031.

A surface F of the reflecting prism 1033 opposite to the light-emitting chip 1031 is a reflecting surface, which is configured to reflect the incident laser beam, so as to achieve the reflective function of the reflecting prism 1033 to the laser beam. In some embodiments, the surface of the reflecting prism 1033 corresponding to the light-emitting assembly 1031 may be coated with a reflective film, so as to form the reflecting surface F.

As shown in FIG. 8, an included angle θ between the reflecting surface F of the reflecting prism 1033 and the inner surface of the base plate 101 may be an acute angle, thereby ensuring that the laser beam emitted by the light-emitting chip 1031 is reflected towards a direction away from the base plate 101. For example, the included angle between the reflecting surface F and the inner surface of the base plate 101 is 30°, 45°, or 60°.

As shown in FIG. 8, in some embodiments, a side surface of the reflecting prism 1033 may be in a shape of a right-angled trapezoid. In some embodiments, the side surface of the reflecting prism 1033 may also be in a shape of a right triangle, an acute triangle, or other shapes. However, the present disclosure is not limited thereto.

As shown in FIGS. 6 and 7, the collimating lens group 109 of the laser device 10 includes a plurality of collimating lenses T corresponding to the plurality of light-emitting chips 1031.

The light-emitting chip 1031 may emit a laser beam to a reflecting surface F of a corresponding reflecting prism 1033, and the reflecting surface F of the reflecting prism 1033 reflects the incident laser beam towards the light transmitting layer 105. After passing through the light transmitting layer 105, the laser beam may be transmitted to the collimating lens T corresponding to the light-emitting chip 1031. The collimating lens T may collimate the incident laser beam and then exit the laser beam, thereby implementing the light-emission of the laser device 10. In some embodiments, the structure of the reflecting prism 1033 may be modified, so that the reflecting prism 1033 collimates the incident laser beam and reflects the laser beam, thereby omitting the collimating lens group 109.

Figure 9:
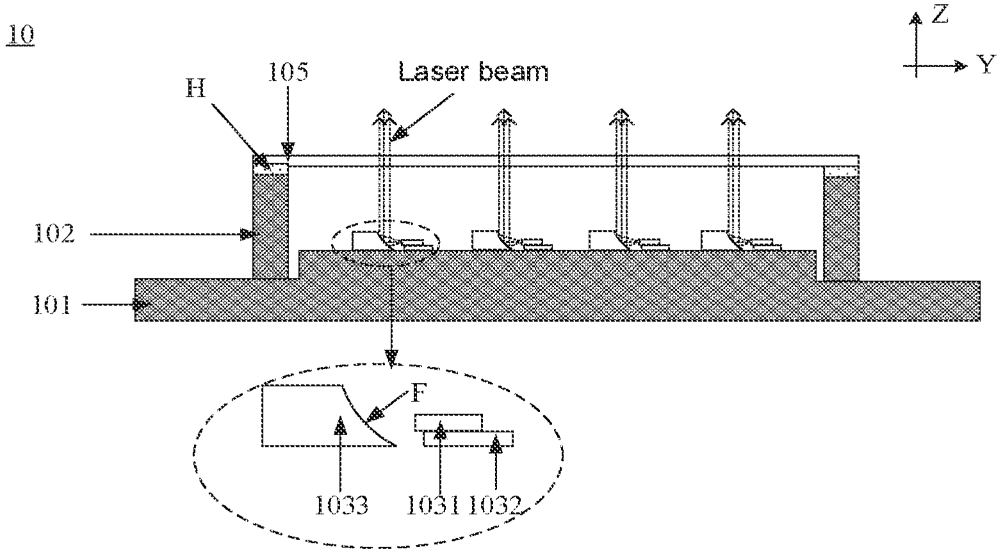
FIG. 9 is a structural diagram of yet another laser device, in accordance with some embodiments.

For example, FIG. 9 is a structural diagram of yet another laser device, in accordance with some embodiments. As shown in FIG. 9, in some embodiments, the reflecting surface F of the reflecting prism 1033 corresponding to the light-emitting chip 1031 is a concave arc surface.

The light-emitting chip 1031 emits the laser beam towards the concave arc surface. The concave arc surface may adjust a divergence angle of the incident laser beam. After collimating the incident laser beam, the laser beam is reflected by the concave arc surface in a direction away from the base plate 101. In this way, the laser beam may be transmitted to the light transmitting layer 105 and exit from the light transmitting layer 105, so as to implement the light-emission of the laser device 10.

In some embodiments of the present disclosure, for the laser device shown in FIG. 9, the reflecting prism 1033 corresponding to the light-emitting chip 1031 may directly collimate the laser beam, and the reflecting prism 1033 may implement the function of the collimating lens group 109. In this way, the collimating lens group 109 may no longer be provided to collimate the laser beam, the components in the laser device may be reduced to a certain extent, and the thickness and the volume of the laser device may be reduced.

In addition, since the coupling process of the collimating lens group is no longer required, the difficulty of manufacturing the laser device may also be reduced. In addition, corresponding reflecting prisms 1033 may be independently and respectively disposed for each light-emitting chip 1031, and the corresponding positional relationship between the reflecting prism 1033 and the light-emitting chip 1031 may be set more accurately, thereby improving the collimating effect of the laser beam emitted by the laser device.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims,

What is claimed is:

1. A laser device, comprising:
- a shell, including:
  - a base plate; and
  - a frame disposed on the base plate and connected to the base plate, so as to provide an accommodating space with an opening; the frame including:
    - a frame body, and
    - a first flange bent relative to the frame body and fixedly connected to the base plate;
- an upper cover assembly fixed to the shell and closing the accommodating space; the upper cover assembly including:
  - a cover plate, an outer edge of the cover plate being fixed to a surface of the frame body away from the base plate; and
  - a light transmitting layer fixed to an inner edge of the cover plate;
- a plurality of light-emitting assemblies located in the accommodating space and disposed on the base plate; and
- a plurality of conductive pins being electrically connected with the plurality of light-emitting assemblies; any one of the plurality of conductive pins being electrically connected to a corresponding light-emitting assembly;
- wherein the frame body includes a plurality of flanging holes, and the plurality of flanging holes correspond to the plurality of conductive pins; a depth of any one of the plurality of flanging holes is greater than a thickness of the frame body; and a portion of the any one of the plurality of conductive pins is located at an outside of the accommodating space through a corresponding one of the plurality of flanging holes; and
- the cover plate includes:
  - an outer edge region fixed to the surface of the frame away from the base plate;
  - an inner edge region fixed to the light transmitting layer; the inner edge region defining an opening, and the light transmitting layer covering and closing the opening; and
  - at least one wrinkle portion located between the outer edge region and the inner edge region; wherein the wrinkle portion is configured to protrude from the inner edge region in a direction away from the base plate or recess in a direction proximate to the base plate.

2. The laser device according to claim 1, further comprising a plurality of flanging portions; any one of the plurality of flanging portions having a tubular shape protruding towards the outside of the accommodating space relative to the frame body; and the any one of the plurality of flanging holes running through the any one of the plurality of flanging portions along an extending direction of the any one of the plurality of flanging portions.

3. The laser device according to claim 2, further comprising a plurality of annular insulators corresponding to the plurality of conductive pins;
- wherein any one of the plurality of annular insulators is located between a corresponding one of the plurality of conductive pins and an inner wall of a corresponding one of the plurality of flanging holes and configured to fix the corresponding conductive pin in the corresponding flanging hole.

4. The laser device according to claim 1, wherein the frame further includes a second flange connected to the frame body; the first flange is located at a side of the frame body, and the second flange is located at another side of the frame body and is opposite to the first flange; and
- the upper cover assembly is fixedly connected to the second flange.

5. The laser device according to claim 4, wherein the first flange is bent towards an inside of the accommodating space relative to the frame body, and the second flange is bent towards the outside of the accommodating space relative to the frame body.

6. The laser device according to claim 1, wherein the frame is a sheet metal member, and a thickness of each position of the frame is a same thickness; and the thickness of the frame is in a range from 0.1 mm to 1 mm, inclusive.

7. The laser device according to claim 1, wherein the cover plate has a same material as the frame.

8. The laser device according to claim 1, wherein the cover plate satisfies at least one of the following:
- the cover plate further includes an outer curved connecting portion connected to the outer edge region and any one of the at least one wrinkle portion; or
- the cover plate further includes an inner curved connecting portion connected to the inner edge region and the any one of the at least one wrinkle portion.

9. The laser device according to claim 1, wherein the cover plate satisfies one of the following:
- the at least one wrinkle portion includes one wrinkle portion protruding from the inner edge region in the direction away from the base plate;
- the at least one wrinkle portion includes two wrinkle portions arranged in a direction from the inner edge region to the outer edge region; the two wrinkle portions protrude from the inner edge region in the direction away from the base plate; or
- the at least one wrinkle portion includes three wrinkle portions arranged in the direction from the inner edge region to the outer edge region; the three wrinkle portions protrude from the inner edge region in the direction away from the base plate.

10. The laser device according to claim 1, wherein at least one of a surface of the light transmitting layer proximate to the base plate and a surface of the light transmitting layer away from the base plate is provided with a brightness enhancement film.

11. The laser device according to claim 1, wherein the upper cover assembly further includes a sealing member, and the light transmitting layer is fixed to the cover plate through the sealing member; and
- the sealing member includes any one of low-temperature glass solder, glass melt glue, or epoxy sealant.

12. The laser device according to claim 1, wherein the base plate includes:
- a middle portion configured to carry the plurality of light-emitting assemblies; and a peripheral portion configured to carry the frame; a thickness of the peripheral portion being less than a thickness of the middle portion.

13. A laser projection apparatus, comprising:

a laser source including the laser device according to claim 1, and the laser source being configured to emit illumination beams;

an optical modulation component being configured to modulate the illumination beams emitted by the laser source to obtain projection beams; and a projection lens being configured to project the projection beams into an image.

14. A laser device comprising:

a shell, including:

a base plate; and a frame disposed on the base plate and connected to the base plate, so as to provide an accommodating space with an opening; the frame including:

a frame body, and a first flange bent relative to the frame body and fixedly connected to the base plate;

an upper cover assembly fixed to the shell and closing the accommodating space; the upper cover assembly including:

a light transmitting layer fixed to a surface of the frame away from the base plate; and a solder layer located between the light transmitting layer and the surface of the frame away from the base plate, so as to fix the light transmitting layer and the surface of the frame away from the base plate;

a plurality of light-emitting assemblies located in the accommodating space and disposed on the base plate; and a plurality of conductive pins being electrically connected with the plurality of light-emitting assemblies; any one of the plurality of conductive pins being electrically connected to a corresponding light-emitting assembly;

wherein the frame body includes a plurality of flanging holes, and the plurality of flanging holes correspond to the plurality of conductive pins; a depth of any one of the plurality of flanging holes is greater than a thickness of the frame body; and a portion of the any one of the plurality of conductive pins is located at an outside of the accommodating space through a corresponding one of the plurality of flanging holes.

15. The laser device according to claim 14, wherein the solder layer includes a platinum layer and a gold-tin alloy layer sequentially stacked along an edge of the light transmitting layer in a direction away from the light transmitting layer.

16. The laser device according to claim 15, wherein a thickness of the platinum layer is in a range from 0.2 μm to 0.3 μm, inclusive;

a thickness of the gold-tin alloy layer is in a range from 2 μm to 3 μm, inclusive; and a width of the solder layer is in a range from 1 mm to 1.5 mm, inclusive.

17. The laser device according to claim 16, wherein the surface of the frame away from the base plate is provided with a gold layer.

18. The laser device according to claim 14, wherein a flatness of the surface of the frame away from the base plate is less than or equal to 0.2 mm.

19. A laser projection apparatus, comprising:

a laser source including the laser device according to claim 14, and the laser source being configured to emit illumination beams;

an optical modulation component being configured to modulate the illumination beams emitted by the laser source to obtain projection beams; and a projection lens being configured to project the projection beams into an image.

* * * * *